United States Patent
Jo et al.

(10) Patent No.: US 10,148,298 B2
(45) Date of Patent: Dec. 4, 2018

(54) RADIO FREQUENCY SWITCH APPARATUS HAVING DYNAMIC BIAS

(71) Applicant: SAMSUNG ELECTRO-MECHANICS CO., LTD., Suwon-si (KR)

(72) Inventors: Byeong Hak Jo, Suwon-si (KR); Jeong Hoon Kim, Suwon-si (KR); Hyun Paek, Suwon-si (KR); Young Wong Jang, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/667,808

(22) Filed: Aug. 3, 2017

(65) Prior Publication Data

US 2018/0145708 A1    May 24, 2018

(30) Foreign Application Priority Data

Nov. 18, 2016    (KR) .................. 10-2016-0154236

(51) Int. Cl.
| | |
|---|---|
| *H03K 17/687* | (2006.01) |
| *H04B 1/10* | (2006.01) |
| *H01P 1/15* | (2006.01) |
| *H03K 17/16* | (2006.01) |
| *H04B 1/50* | (2006.01) |

(52) U.S. Cl.
CPC ............ *H04B 1/109* (2013.01); *H01P 1/15* (2013.01); *H03K 17/162* (2013.01); *H04B 1/50* (2013.01); *H03K 2217/0018* (2013.01); *H03K 2217/0054* (2013.01)

(58) Field of Classification Search
None
See application file for complete search history.

(56) References Cited

U.S. PATENT DOCUMENTS

| | | | | |
|---|---|---|---|---|
| 4,237,897 A | * | 12/1980 | Beane | .................... A61N 1/378 |
| | | | | 607/34 |
| 5,570,004 A | * | 10/1996 | Shibata | ..................... G05F 1/56 |
| | | | | 323/274 |

(Continued)

FOREIGN PATENT DOCUMENTS

| | | |
|---|---|---|
| JP | 2005-515657 A | 5/2005 |
| JP | 2014-232941 A | 12/2014 |

(Continued)

*Primary Examiner* — Cassandra Cox
(74) *Attorney, Agent, or Firm* — NSIP Law (57) ABSTRACT

A radio frequency switch apparatus includes a radio frequency switch, a dynamic bias circuit, and a switch control circuit. The radio frequency switch includes a first radio frequency switch circuit connected between a first signal terminal and an input terminal. The first radio frequency switch circuit includes a series switch and a shunt switch. The dynamic bias circuit is configured to generate a bias voltage and a buffer voltage lower than a battery voltage by a preset voltage, using the battery voltage and configured to output the bias voltage to a signal line connected to the input terminal. The switch control circuit is configured to generate first and second gate voltages to switch the first radio frequency switch circuit, based on a band selection signal, using the battery voltage and the buffer voltage.

14 Claims, 7 Drawing Sheets

(56) References Cited

U.S. PATENT DOCUMENTS

| | | | |
|---|---|---|---|
| 6,377,112 B1* | 4/2002 | Rozsypal | H01L 27/0921 |
| | | | 327/534 |
| 9,231,578 B2 | 1/2016 | Chih-Sheng | |
| 9,231,587 B2 | 1/2016 | Miyazaki et al. | |
| 2007/0210866 A1* | 9/2007 | Sato | H03F 3/195 |
| | | | 330/126 |
| 2008/0272824 A1 | 11/2008 | Fu et al. | |
| 2012/0064952 A1* | 3/2012 | Iijima | H03K 17/6221 |
| | | | 455/571 |
| 2014/0049311 A1 | 2/2014 | Yang et al. | |
| 2017/0033785 A1* | 2/2017 | Nguyen | H03K 17/162 |
| 2018/0108988 A1* | 4/2018 | Liu | H01Q 3/247 |

FOREIGN PATENT DOCUMENTS

| | | |
|---|---|---|
| KR | 10-2014-0023227 A | 2/2014 |
| WO | WO 03/032431 A2 | 4/2003 |

\* cited by examiner

RADIO FREQUENCY SWITCH APPARATUS HAVING DYNAMIC BIAS

CROSS-REFERENCE TO RELATED APPLICATION(S)

This application claims benefit under 35 USC 119(a) of Korean Patent Application No. 10-2016-0154236 filed on Nov. 18, 2016 in the Korean Intellectual Property Office, the disclosure of which is incorporated herein by reference for all purposes.

BACKGROUND

1. Field

The present disclosure relates to a radio frequency switch apparatus having a dynamic bias.

2. Description of Related Art

Due to a gradual increase in complexity of power amplifier modules, a silicon-on-insulator (SOI) complementary metal oxide semiconductor (CMOS) switch has become a competitive solution to a conventional pseudomorphic high electron mobility transistor (PHEMT) switch based on radio frequency (RF) performance and a higher degree of integration.

Further, although a bulk CMOS is a competitive solution in terms of degree of integration and cost, it essentially uses a lossy substrate, and thus may not be an optimal alternative in terms of insertion loss or isolation and power handling (P1dB). On the other hand, an SOI CMOS process may accomplish satisfactory performance, at a cost cheaper than that of a bulk process, and may be considered as optimal in an RF switch process.

To date, an RF switch integrated circuit (IC) manufactured by an SOI CMOS process uses a floating gate/body method, a negative biasing method, a stacked-field effect transistor (FET) method, or the like, in order to satisfy requirements for high power handling, reduction of insertion loss, and harmonic characteristics.

A negative generation circuit used in an existing radio frequency switch may include an oscillator including a buffer, a charge pump generating a negative voltage, and a low pass filter.

The charge pump receives a differential clock from the oscillator (OSC) and generates a negative voltage, as an input to a driver or a buffer of a band selection switch (BSSW) circuit to turn on/off a band selection switch (BBSW).

The negative voltage generated by the negative generation circuit is used as a gate voltage for turning off a switch element of the RF switch integrated circuit. The RF switch integrated circuit includes a series switch and a shunt switch, and both include one or more transistors or resistors depending on the magnitude of an input signal and required performance.

As described above, the RF switch integrated circuit uses the negative biasing method in order to satisfy the requirements for the high power handling, reduced insertion loss, and harmonic characteristics, and applies the negative voltage generated by a negative voltage generation circuit to a gate of a turned-off switch when turning off the switch, resulting in improvement of characteristics.

However, the existing RF switch integrated circuit using the negative voltage has problems, such as spurious emissions and an extended turn-on time.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency switch apparatus includes a radio frequency switch, a dynamic bias circuit, and a switch control circuit. The radio frequency switch includes a first radio frequency switch circuit connected between a first signal terminal and an input terminal. The first radio frequency switch circuit includes a series switch and a shunt switch. The dynamic bias circuit is configured to generate a bias voltage and a buffer voltage lower than a battery voltage by a preset voltage, using the battery voltage and providing the bias voltage to a signal line connected to the input terminal. The switch control circuit is configured to generate first and second gate voltages for switching the first radio frequency switch circuit, based on a band selection signal, using the battery voltage and the buffer voltage.

The switch control circuit may be configured to generate first and second body voltages to switch the first radio frequency switch circuit, based on the band selection signal, using the battery voltage and the buffer voltage.

The dynamic bias circuit may generate the bias voltage using a voltage difference between the battery voltage and a reference voltage, and generates the buffer voltage using the bias voltage.

The dynamic bias circuit may include a subtraction circuit comprising an operational amplifier subtracting a reference voltage from the battery voltage and outputting the bias voltage; a first filter circuit configured to remove alternating current (AC) noise from the bias voltage; and an output circuit comprising a first output buffer outputting the bias voltage supplied from the first filter circuit, and a second output buffer connected to the first output buffer in parallel and outputting the bias voltage as the buffer voltage.

The switch control circuit may include a level shifter, configured to shift a voltage level of the band selection signal using the battery voltage and the buffer voltage; and a buffer circuit configured to generate the first and second gate voltages and the first and second body voltages to switch the first radio frequency switch circuit, based on a band selection signal level-shifted by the level shifter.

The level shifter may include a constant voltage protecting circuit configured to block static electricity in an input terminal of the band selection signal; a second filter circuit configured to remove noise from the band selection signal provided from the constant voltage protecting circuit; a level shift circuit configured to shift the voltage level of the band selection signal provided from the second filter circuit up to a preset voltage level; and a final level shift circuit configured to shift the band selection signal provided from the level shift circuit up to levels of the battery voltage and the buffer voltage.

The buffer circuit may include a decoder, configured to decode the band selection signal level-shifted by the level shifter to generate a plurality of control signals; an inverter configured to invert a subset of the plurality of control signals to output series control signals; a first buffer circuit configured to output the first gate voltage and the first body voltage to the series switch based on the series control signals; and a second buffer circuit configured to output the second gate voltage and the second body voltage to the shunt switch based a remainder of the plurality of control signals.

In another general aspect, a radio frequency switch apparatus includes a radio frequency switch, a dynamic bias circuit, and a switch control circuit. The radio frequency switch includes radio frequency switch circuits connected between respective signal terminals and an input terminal, wherein each of the radio frequency switch circuits comprises series switches and shunt switches. The dynamic bias circuit is configured to generate a bias voltage and a buffer voltage lower than a battery voltage by a preset voltage, using the battery voltage and outputting the bias voltage to a signal line connected to the input terminal. The switch control circuit is configured to generate first and second gate voltages to switch the radio frequency switch circuits, respectively, based on a band selection signal, using the battery voltage and the buffer voltage.

The switch control circuit may be configured to generate first and second body voltages to switch the radio frequency switch circuits, respectively, based on the band selection signal, using the battery voltage and the buffer voltage.

The dynamic bias circuit may be configured to generate the bias voltage using a voltage difference between the battery voltage and a reference voltage, and generates the buffer voltage using the bias voltage.

The dynamic bias circuit may include a subtraction circuit comprising an operational amplifier subtracting a reference voltage from the battery voltage and outputting the bias voltage; a first filter circuit configured to remove alternating current (AC) noise from the bias voltage; and an output circuit comprising a first output buffer outputting the bias voltage supplied from the first filter circuit, and a second output buffer that is connected to the first output buffer in parallel and outputting the bias voltage as the buffer voltage.

The switch control circuit may include a level shifter, configured to shift a voltage level of the band selection signal using the battery voltage and the buffer voltage; and a buffer circuit, configured to generate gate voltages and body voltages to switch the radio frequency switch circuits, respectively, based on a band selection signal level-shifted by the level shifter.

The level shifter may include a constant voltage protecting circuit configured to block static electricity in an input terminal of the band selection signal; a second filter circuit configured to remove noise from the band selection signal provided from the constant voltage protecting circuit; a level shift circuit configured to shift the voltage level of the band selection signal provided from the second filter circuit up to a preset voltage level; and a final level shift circuit configured to shift the band selection signal provided from the level shift circuit up to levels of the battery voltage and the buffer voltage.

The buffer circuit may include a decoder configured to decode the band selection signal level-shifted by the level shifter, to generate a plurality of control signals; an inverter configured to invert a subset of the plurality of control signals to output series control signals; a first buffer circuit configured to output the first gate voltage and the first body voltage to the series switch based on the series control signals; and a second buffer circuit configured to output the second gate voltage and the second body voltage to the shunt switch, based a remainder of the plurality of control signals.

Other features and aspects will be apparent from the following detailed description, the drawings, and the claims.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
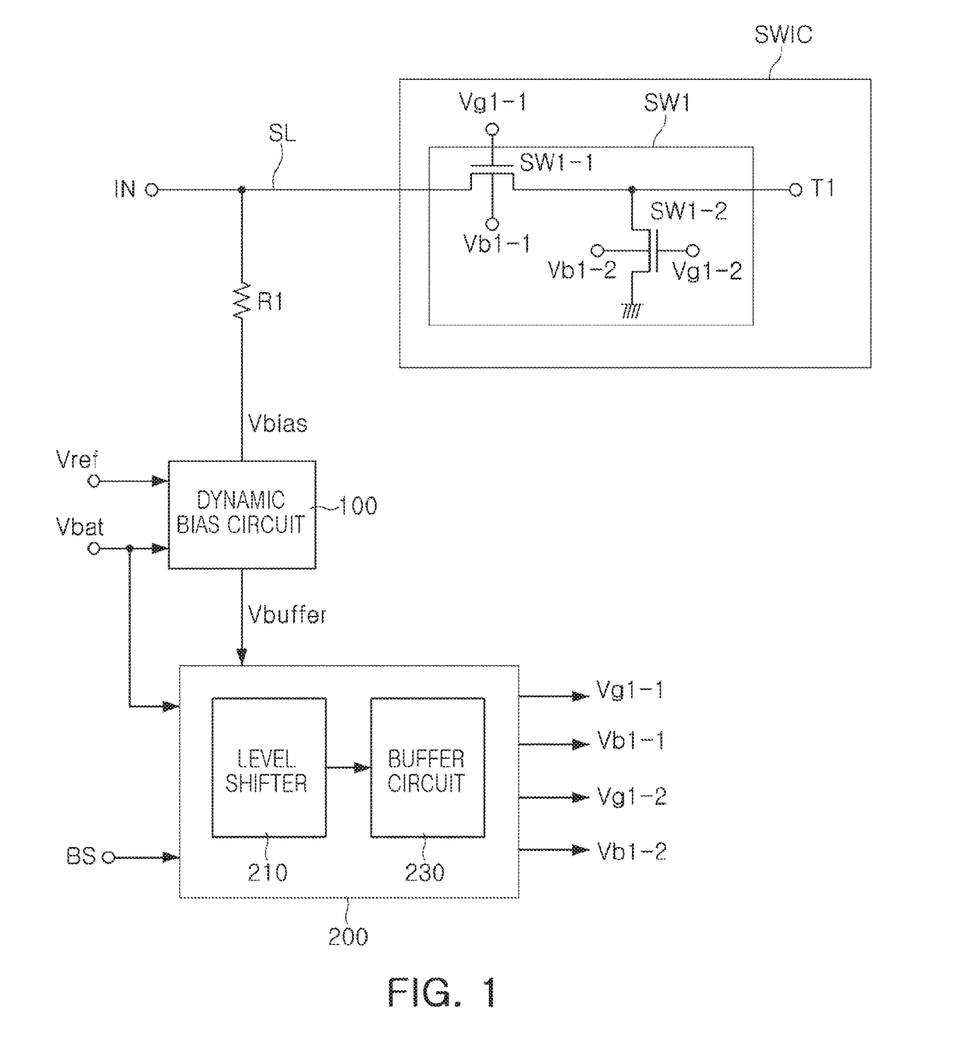
FIG. 1 is a block diagram illustrating an example of a radio frequency switch apparatus.

FIG. 1 is a block diagram illustrating an example of a radio frequency switch apparatus in the present disclosure.

Referring to FIG. 1, the radio frequency switch circuit includes a radio frequency switch SWIC, a dynamic bias circuit 100, and a switch control circuit 200.

When the radio frequency switch SWIC is a single pole single throw (SPST) type switch, the radio frequency switch SWIC includes a first radio frequency switch circuit SW1 connected between a first signal terminal T1 and an input terminal IN.

The first radio frequency switch circuit SW1 includes a series switch SW1-1 connected to a signal line SL, between the first signal terminal T1 and the input terminal IN, and a shunt switch SW1-2 connected between the first signal terminal T1 and a ground.

In an example, both the series switch SW1-1 and the shunt switch SW1-2 have a plurality of switch elements connected to each other in series. Here, the plurality of switch elements are metal oxide semiconductor (MOS) transistors, but are not limited thereto.

In each example in the present disclosure, a case in which the series switch SW1-1 and the shunt switch SW1-2 are MOS transistors will be described. In the examples, gates of the series switch SW1-1 and the shunt switch SW1-2 receive a first gate voltage Vg1-1 and a second gate voltage Vg1-2, respectively.

In addition, bodies of the series switch SW1-1 and the shunt switch SW1-2 receive a first body voltage Vb1-1 and a second body voltage Vb1-2, respectively.

The dynamic bias circuit 100 generates a bias voltage Vbias and a buffer voltage Vbuffer lower than a battery voltage Vbat by a preset voltage, using the battery voltage Vbat and provides the bias voltage Vbias, connected to the input terminal IN, to the signal line SL.

The switch control circuit 200 generates the first and second gate voltages Vg1-1 and Vg1-2 for switching the first radio frequency switch circuit SW1, depending on a band selection signal BS, using the battery voltage Vbat and the buffer voltage Vbuffer.

In addition, the switch control circuit 200 generates the first and second body voltages Vb1-1 and Vb1-2 for switching the first radio frequency switch circuit SW1, depending on the band selection signal BS, using the battery voltage Vbat and the buffer voltage Vbuffer, in order to prevent deterioration of performance due to body effects of the MOS transistors used as the switch elements.

The switch control circuit 200 includes a level shifter 210 and a buffer circuit 230.

The level shifter 210 shifts a voltage level of the band selection signal BS using the battery voltage Vbat and the buffer voltage Vbuffer.

The buffer circuit 230 generates the first and second gate voltages Vg1-1 and Vg1-2 and the first and second body voltages Vb1-1 and Vb1-2 for switching the first radio frequency switch circuit SW1, depending on a band selection signal IBS level-shifted by the level shifter 210.

Figure 2:
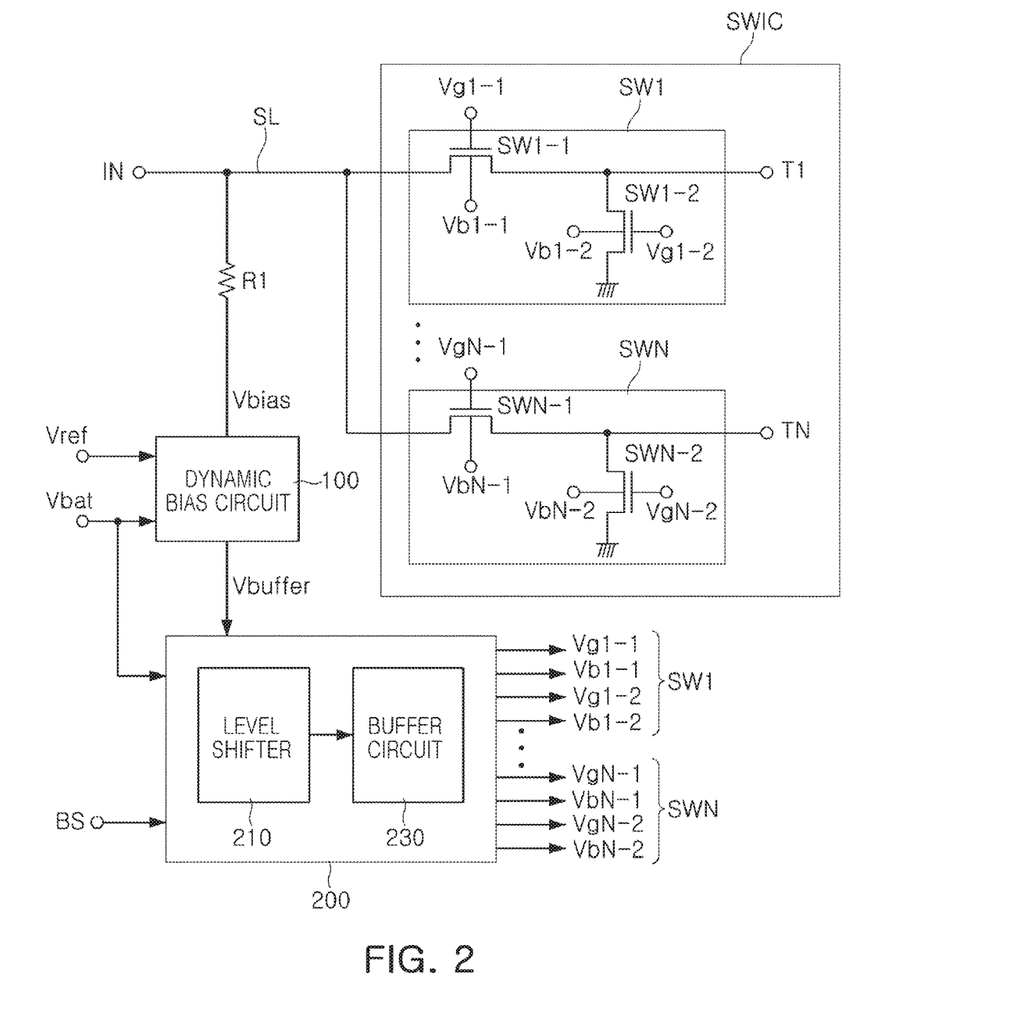
FIG. 2 is a block diagram illustrating another example of a radio frequency switch apparatus.

FIG. 2 is a block diagram illustrating another example of a radio frequency switch apparatus in the present disclosure.

Referring to FIG. 2, the radio frequency switch circuit includes a radio frequency switch SWIC, a dynamic bias circuit 100, and a switch control circuit 200.

When the radio frequency switch SWIC is a single pole multi throw (SPMT) type switch, the radio frequency switch SWIC includes first to N-th radio frequency switch circuits SW1 to SWN connected between first to N-th signal terminals T1 to TN and an input terminal IN, respectively.

The first to N-th radio frequency switch circuits SW1 to SWN include series switches SW1-1 to SWN-1, connected to a signal line SL between each of the first to N-th signal terminals T1 to TN and an input terminal IN and shunt switches SW1-2 to SWN-2 connected between the corresponding signal terminals and a ground, respectively.

As an example, each of the series switches SW1-1 to SWN-1 and the shunt switches SW1-2 to SWN-2 have a plurality of switch elements connected to each other in series. Here, the plurality of switch elements are MOS transistors, but are not limited thereto.

In each example in the present disclosure, a case in which the series switches SW1-1 to SWN-1 and the shunt switches SW1-2 to SWN-2 are the MOS transistors will be described. In this case, gates of the series switches SW1-1 to SWN-1 and the shunt switches SW1-2 to SWN-2 receive first gate voltages Vg1-1 to VgN-1 and second gate voltages Vg1-2 to VgN-2, respectively.

In addition, bodies of the series switches SW1-1 to SWN-1 and the shunt switches SW1-2 to SWN-2 receive first body voltages Vb1-1 to VbN-1 and second body voltages Vb1-2 to VbN-2, respectively.

The dynamic bias circuit 100 generates a bias voltage Vbias and a buffer voltage Vbuffer lower than a battery voltage Vbat by a preset voltage, using the battery voltage Vbat, and provide the bias voltage Vbias to the signal line SL connected to the input terminal IN.

The switch control circuit 200 generates the first and second gate voltages Vg1-1 to VgN-1 and Vg1-2 to VgN-2 for switching the first to N-th radio frequency switch circuits SW1 to SWN, respectively, depending on a band selection signal BS, using the battery voltage Vbat and the buffer voltage Vbuffer.

In addition, the switch control circuit 200 generates the first and second body voltages Vb1-1 to VbN-1 and Vb1-2 to VbN-2 for switching the first to N-th radio frequency switch circuits SW1 to SWB, respectively, depending on the band selection signal BS, using the battery voltage Vbat and the buffer voltage Vbuffer, in order to prevent deterioration of performance due to body effects of the MOS transistors used as the switch elements.

The switch control circuit 200 includes a level shifter 210 and a buffer circuit 230.

The level shifter 210 shifts a voltage level of the band selection signal BS using the battery voltage Vbat and the buffer voltage Vbuffer.

The buffer circuit 230 generates the first and second gate voltages Vg1-1 to VgN-1 and Vg1-2 to VgN-2 and the first and second body voltages Vb1-1 to VbN-1 and Vb1-2 to VbN-2 for switching the first to N-th radio frequency switch circuits SW1 to SWN, respectively, depending on a band selection signal IBS level-shifted by the level shifter 210.

Figure 3:
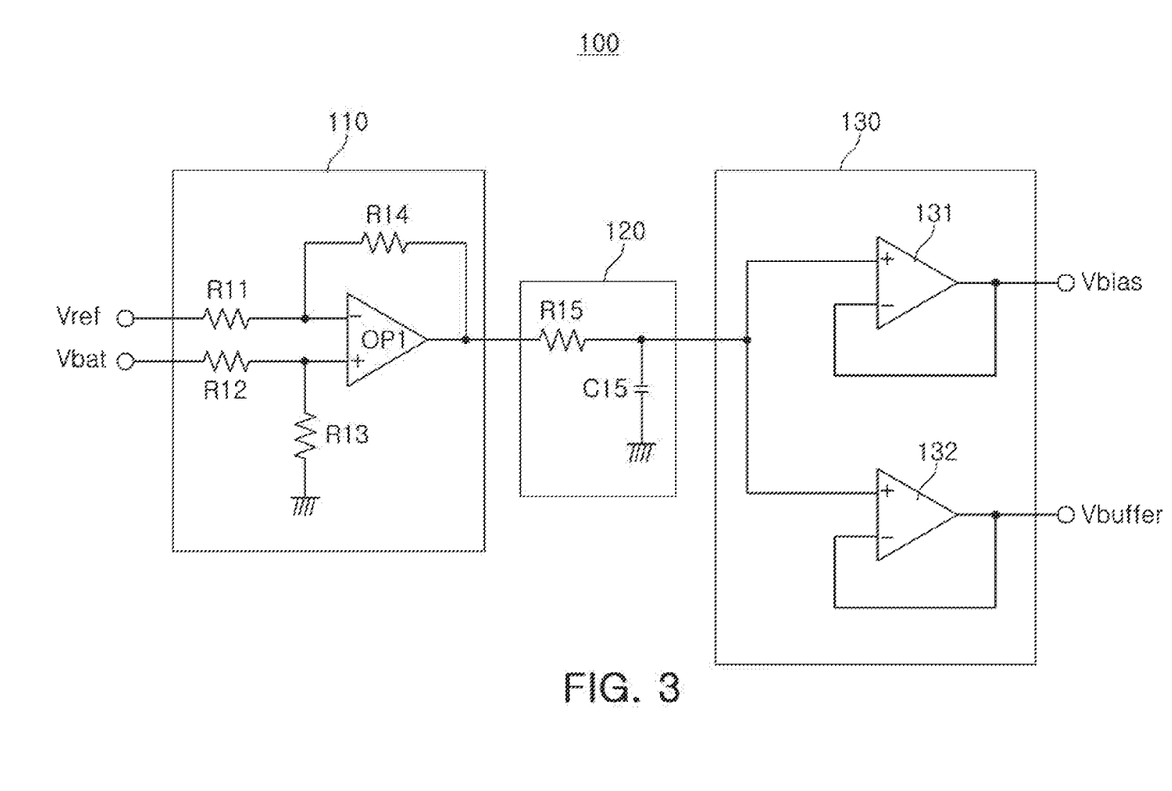
FIG. 3 is a block diagram illustrating an example of a dynamic bias circuit.

FIG. 3 is a block diagram illustrating an example of a dynamic bias circuit in the present disclosure.

Referring to FIG. 3, the dynamic bias circuit 100 generates the bias voltage Vbias using a voltage difference between the battery voltage Vbat and a reference voltage Vref, and generates the buffer voltage Vbuffer using the bias voltage Vbias.

The dynamic bias circuit 100 includes a subtraction circuit 110, a first filter circuit 120, and an output circuit 130.

The subtraction circuit 110 includes an operational amplifier OP1 having an inverting input terminal receiving the reference voltage Vref through a resistor R11 and connected to an output terminal through a resistor R14, and a non-inverting input terminal receiving the battery voltage Vbat through a resistor R12 and connected to a ground through a resistor R13. The operational amplifier OP1 subtracts the reference voltage Vref from the battery voltage Vbat and outputs the bias voltage Vbias.

For example, when the resistor R11 and the resistor R12 are set to have the same resistance value and the third resistor R13 and the resistor R14 are set to have the same resistance value, the bias voltage Vbias is determined to be (Vbat−Vref)×(R14/R11). In this example, when the resistor R11 and the resistor R14 are set to have the same resistance value, the bias voltage Vbias is (Vbat−Vref).

The first filter circuit 120 removes alternating current (AC) noise from the bias voltage Vbias. As an example, the first filter circuit 120 is formed of an RC filter including a resistor R15 and a capacitor C15.

In addition, the output circuit 130 includes a first output buffer 131 and a second output buffer 132, the first output buffer 131 provides the bias voltage Vbias, supplied from the first filter circuit 120, and the second output buffer 132 is connected to the first output buffer 131 in parallel, and provides the bias voltage Vbias as the buffer voltage Vbuffer.

As an example, in a case in which the battery voltage Vbat is varied in a range of 3.7V to 4.5V, when the battery voltage Vbat is 4.0V and the reference voltage Vref is 2.5V, the bias voltage Vbias and the buffer voltage Vbuffer is 1.5V. Alternatively, when the battery voltage Vbat is 4.5V and the reference voltage Vref is 2.5V, the bias voltage Vbias and the buffer voltage Vbuffer is 2V.

As described above, even though the battery voltage Vbat varies, the battery voltage Vbat and the bias voltage Vbias maintain a voltage difference therebetween based on the reference voltage Vref.

Therefore, when the MOS transistor of the series switch included in the radio frequency switch apparatus is in a turn-on state, a high level of the battery voltage Vbat is input to the gate of the MOS transistor and the bias voltage is supplied to the signal line, such that a gate-source voltage of the MOS transistor is the same as the reference voltage, regardless of the battery voltage variation. Therefore, insertion loss characteristics of the radio frequency switch apparatus is maintained at a specific level or higher, regardless of the battery voltage variation.

Figure 4:
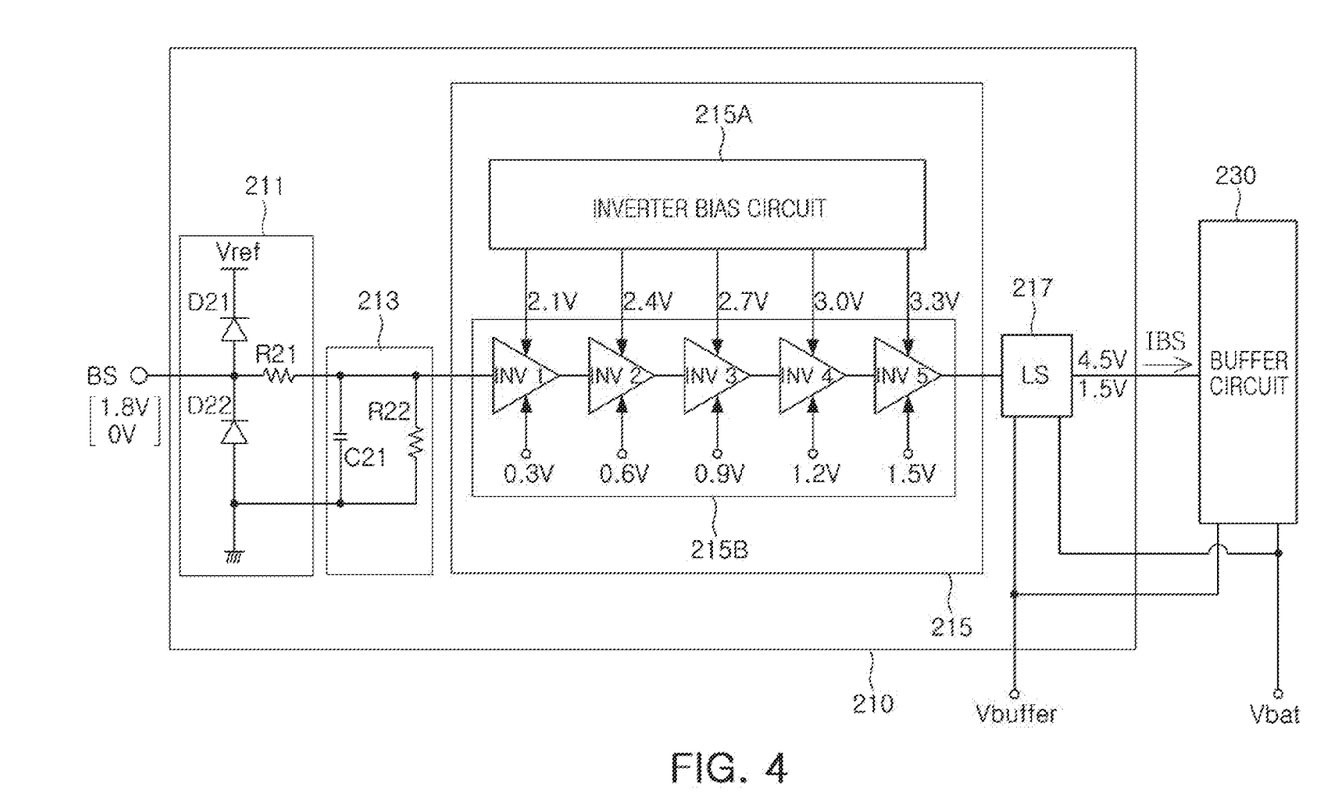
FIG. 4 is a block diagram illustrating an example of a level shifter.

FIG. 4 is a block diagram illustrating an example of a level shifter in the present disclosure.

Referring to FIG. 4, the level shifter 210 includes a constant voltage protecting circuit 211, a second filter circuit 213, a level shift circuit 215, and a final level shift circuit 217.

The constant voltage protecting circuit 211 blocks static electricity in an input terminal of the band selection signal BS to protect an internal circuit. As an example, the constant voltage protecting circuit 211 includes diodes D21 and D22 connected to each other in series between a reference voltage Vref terminal and a ground to maintain a constant voltage.

The second filter circuit 213 removes noise from the band selection signal BS provided from the constant voltage protecting circuit 211. As an example, the second filter circuit 213 includes an RC parallel circuit including a resistor R22 and a capacitor C21 connected to each other in parallel between an output terminal of the constant voltage protecting circuit 211 and the ground.

The level shift circuit 215 shifts the voltage level of the band selection signal BS provided from the second filter circuit 213 up to a preset voltage level.

As an example, the level shift circuit 215 includes an inverter bias circuit 215A and an inverter circuit 215B.

The inverter bias circuit 215A supplies a plurality of bias voltages, of which voltage levels rise stepwise to the inverter circuit 215B.

The inverter circuit 215B includes a plurality of inverters INV1 to INV5 connected to each other in series between the second filter circuit 213 and the final level shift circuit 217, and the plurality of inverters INV1 to INV5 raises the voltage level of the band selection signal BS stepwise, using the plurality of bias voltages supplied from the inverter bias circuit 215A, respectively.

As an example, in a case in which the inverter circuit 215B includes first to fifth inverters INV1 to INV5, when a high-level voltage of the band selection signal BS is 1.8V and a low-level voltage of the band selection signal BS is 0V, the first inverter INV1 outputs a high-level voltage of 2.1V and a low-level voltage of 0.3V, the second inverter INV2 outputs a high-level voltage of 2.4V and a low-level voltage of 0.6V, the third inverter INV3 outputs a high-level voltage of 2.7V and a low-level voltage of 0.9V, the fourth inverter INV4 outputs a high-level voltage of 3.0V and a low-level voltage of 1.2V, and the fifth inverter INV5 outputs a high-level voltage of 3.3V and a low-level voltage of 1.5V.

Here, the number of inverters included in the inverter circuit 215B, or the number of steps of leveling up a voltage is determined in advance, depending on the voltage level of the band selection signal and a voltage level of the battery voltage Vbat and the buffer voltage Vbuffer.

In addition, the final level shift circuit 217 shifts the band selection signal BS, provided from the level shift circuit 215 up to levels of the battery voltage Vbat and the buffer voltage Vbuffer, using the battery voltage Vbat and the buffer voltage Vbuffer.

As an example, when the battery voltage Vbat is 4.0V and the buffer voltage Vbuffer is 1.5V, the final level shift circuit 217 shifts the high-level voltage of the band selection signal BS provided from the level shift circuit 215 up to 4.0V and shift the low-level voltage of the band selection signal BS up to 1.5V.

Figure 5:
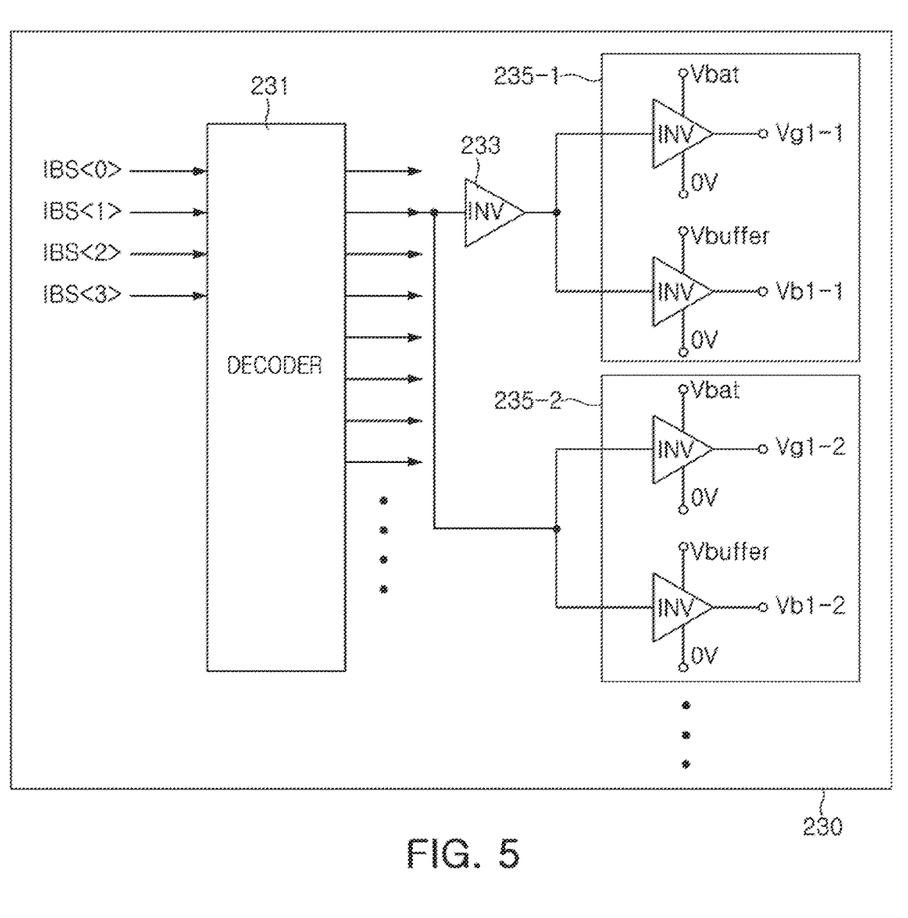
FIG. 5 is a block diagram illustrating an example of a buffer circuit.

FIG. 5 is a block diagram illustrating an example of a buffer circuit in the present disclosure.

Referring to FIG. 5, the buffer circuit 230 includes a decoder 231, an inverter 233, a first buffer circuit 235-1, and a second buffer circuit 235-2.

The decoder 231 decodes the band selection signal IBS, level-shifted by the level shifter 210, to generate control signals for the radio frequency switch. As an example, when the decoder 231 is a 4-to-16 encoder, the decoder 231 generates sixteen control signals from four bits of band selection signals IBS (IBS<0>, IBS<1>, IBS<2>, and IBS<3>), and when one radio frequency switch circuit requires four control signals (two gate voltages and two body voltages), four radio frequency switch circuits are controlled using the four bits of band selection signals IBS.

The inverter 233 inverts some of the control signals for the radio frequency switch to provide series control signals for the corresponding radio frequency switch circuit.

The first buffer circuit 235-1 provides the first gate voltage Vg1-1 and the first body voltage Vb1-1 to the series switch SW1-1, depending on the series control signals provided from the inverter 233.

The second buffer circuit 235-2 provides the second gate voltage Vg1-2 and the second body voltage Vb1-2 to the shunt switch SW1-2, depending on shunt control signals that do not pass through the inverter 233 among the control signals provided from the decoder 231.

As described above, when the first gate voltage Vg1-1 and the first body voltage Vb1-1 configures the series switch SW1-1 to a turn-on state, the first gate voltage Vg1-1 and the first body voltage Vb1-1 become the battery voltage Vbat and the buffer voltage Vbuffer, and when the first gate voltage Vg1-1 and the first body voltage Vb1-1 configures the series switch SW1-1 to a turn-off state, the first gate voltage Vg1-1 and the first body voltage Vb1-1 have a zero (0) voltage.

Figure 6A:
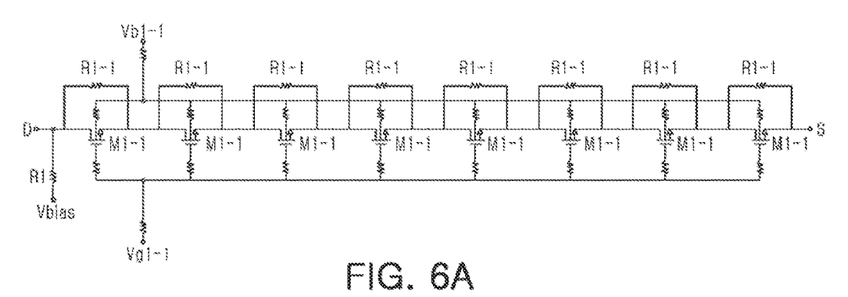
FIGS. 6A through 6C are examples of circuit diagrams depicting dynamic biasing.
Figure 6B:
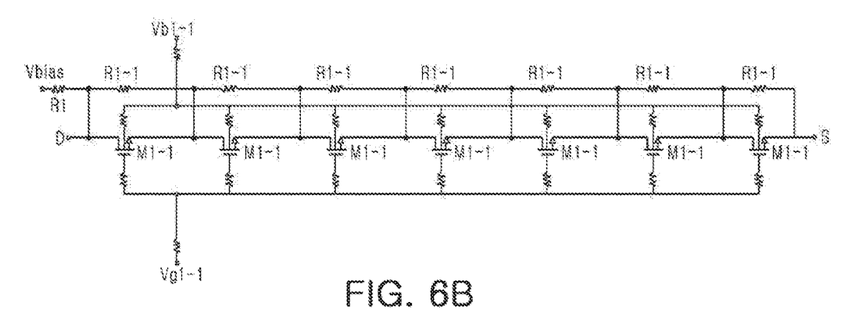
Figure 6C:
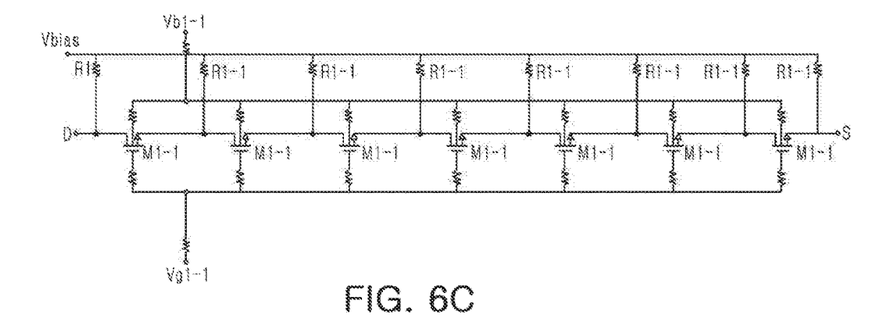

FIGS. 6A through 6C are circuit diagrams for describing dynamic biasing in the present disclosure.

In FIGS. 6A through 6C, the bias voltage Vbias by the dynamic bias is supplied between first transistors M1-1 of series switch circuits and an input terminal IN through resistors R1 and R1-1.

In addition, the bias voltage Vbias is supplied between a plurality of transistors M1-1 of the series switch circuits through resistors which are connected differently to each other, as illustrated in FIGS. 6A through 6C.

FIGS. 6A through 6C illustrate examples of supplying the bias voltage Vbias, but are not limited thereto.

Figure 7:
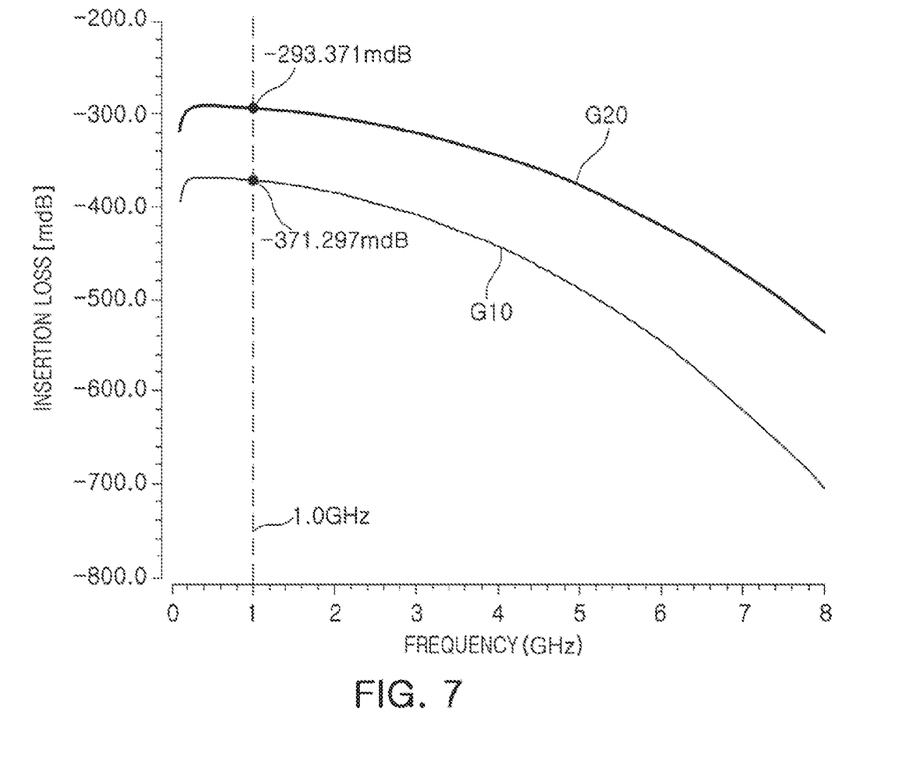
FIG. 7 is a graph illustrating insertion loss according to an example in the present disclosure and the related art.

FIG. 7 is a graph illustrating insertion loss in the present disclosure and insertion loss based on the related art.

G10 of FIG. 7 depicts insertion loss of the related art, in which a low-level voltage of a gate voltage is used as a negative voltage, and G20 of FIG. 7 depicts insertion loss in the present disclosure, in which a bias voltage dynamically varied, depending on a battery voltage, is used in a signal line.

Referring to G10 and G20 of FIG. 7, at a frequency of 1 GHz, insertion loss according to the related art is about −371.297[mdB], and insertion loss in the present disclosure is improved to about −293.371[dB].

As set forth above, in the present disclosure, the voltage difference between a high level of a control voltage of a switch element and a level of a bias voltage supplied to a signal line is controlled to be constant, regardless a battery voltage variation, by using a dynamic bias. Therefore, a negative voltage is not used, such that a negative influence due to spurious emission be prevented and insertion loss characteristics be maintained, regardless of the battery voltage variation.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency switch apparatus, comprising:
a radio frequency switch comprising a first radio frequency switch circuit connected between a first signal terminal and an input terminal, the first radio frequency switch circuit comprising a series switch and a shunt switch;
a dynamic bias circuit configured to generate a bias voltage and a buffer voltage lower than a battery voltage and provide the bias voltage to a signal line connected to the input terminal; and
a switch control circuit configured to generate first and second gate voltages to switch the first radio frequency switch circuit, based on a band selection signal, using the battery voltage and the buffer voltage.

2. The radio frequency switch apparatus of claim 1, wherein the switch control circuit is configured to generate first and second body voltages to switch the first radio frequency switch circuit, based on the band selection signal, using the battery voltage and the buffer voltage.

3. The radio frequency switch apparatus of claim 1, wherein the dynamic bias circuit is configured to generate the bias voltage using a voltage difference between the battery voltage and a reference voltage, and generate the buffer voltage using the bias voltage.

4. The radio frequency switch apparatus of claim 2, wherein the dynamic bias circuit comprises:
a subtraction circuit comprising an operational amplifier configured to subtract a reference voltage from the battery voltage and output the bias voltage;
a first filter circuit configured to remove alternating current (AC) noise from the bias voltage; and
an output circuit comprising a first output buffer configured to output the bias voltage supplied from the first filter circuit, and a second output buffer connected to the first output buffer in parallel and configured to output the bias voltage as the buffer voltage.

5. The radio frequency switch apparatus of claim 2, wherein the switch control circuit comprises:
a level shifter, configured to shift a voltage level of the band selection signal using the battery voltage and the buffer voltage; and
a buffer circuit configured to generate the first and second gate voltages and the first and second body voltages to switch the first radio frequency switch circuit, based on a band selection signal level-shifted by the level shifter.

6. The radio frequency switch apparatus of claim 5, wherein the level shifter comprises:
a constant voltage protecting circuit configured to block static electricity in an input terminal of the band selection signal;
a second filter circuit configured to remove noise from the band selection signal provided from the constant voltage protecting circuit;
a level shift circuit configured to shift the voltage level of the band selection signal provided from the second filter circuit up to a preset voltage level; and
a final level shift circuit configured to shift the band selection signal provided from the level shift circuit up to levels of the battery voltage and the buffer voltage.

7. The radio frequency switch apparatus of claim 5, wherein the buffer circuit comprises:

a decoder, configured to decode the band selection signal level-shifted by the level shifter to generate control signals;

an inverter configured to invert a subset of the control signals to output series control signals;

a first buffer circuit configured to output the first gate voltage and the first body voltage to the series switch based on the series control signals; and a second buffer circuit configured to output the second gate voltage and the second body voltage to the shunt switch based on the control signals excluding the subset of control signals.

8. A radio frequency switch apparatus, comprising:

a radio frequency switch comprising radio frequency switch circuits connected between respective signal terminals and an input terminal, wherein each of the radio frequency switch circuits comprises series switches and shunt switches;

a dynamic bias circuit configured to generate a bias voltage and a buffer voltage lower than a battery voltage, using the battery voltage and outputting the bias voltage to a signal line connected to the input terminal; and a switch control circuit configured to generate first and second gate voltages to switch the radio frequency switch circuits, respectively, based on a band selection signal, using the battery voltage and the buffer voltage.

9. The radio frequency switch apparatus of claim 8, wherein the switch control circuit is configured to generate first and second body voltages to switch the radio frequency switch circuits, respectively, based on the band selection signal, using the battery voltage and the buffer voltage.

10. The radio frequency switch apparatus of claim 8, wherein the dynamic bias circuit is configured to generate the bias voltage using a voltage difference between the battery voltage and a reference voltage, and generate the buffer voltage using the bias voltage.

11. The radio frequency switch apparatus of claim 9, wherein the dynamic bias circuit comprises:

a subtraction circuit comprising an operational amplifier configured to subtract a reference voltage from the battery voltage and output the bias voltage;

a first filter circuit configured to remove alternating current (AC) noise from the bias voltage; and an output circuit comprising a first output buffer configured to output the bias voltage supplied from the first filter circuit, and a second output buffer that is connected to the first output buffer in parallel and configured to output the bias voltage as the buffer voltage.

12. The radio frequency switch apparatus of claim 9, wherein the switch control circuit comprises:

a level shifter, configured to shift a voltage level of the band selection signal using the battery voltage and the buffer voltage; and a buffer circuit, configured to generate gate voltages and body voltages to switch the radio frequency switch circuits, respectively, based on a band selection signal level-shifted by the level shifter.

13. The radio frequency switch apparatus of claim 12, wherein the level shifter comprises:

a constant voltage protecting circuit configured to block static electricity in an input terminal of the band selection signal;

a second filter circuit configured to remove noise from the band selection signal provided from the constant voltage protecting circuit;

a level shift circuit configured to shift the voltage level of the band selection signal provided from the second filter circuit up to a preset voltage level; and a final level shift circuit configured to shift the band selection signal provided from the level shift circuit up to levels of the battery voltage and the buffer voltage.

14. The radio frequency switch apparatus of claim 12, wherein the buffer circuit comprises:

a decoder configured to decode the band selection signal level-shifted by the level shifter, to generate control signals;

an inverter configured to invert a subset of the control signals to output series control signals;

a first buffer circuit configured to output the first gate voltage and the first body voltage to the series switch based on the series control signals; and a second buffer circuit configured to output the second gate voltage and the second body voltage to the shunt switch based on the control signals excluding the subset of control signals.

* * * * *